US009374643B2

United States Patent
Szczech et al.

(10) Patent No.: US 9,374,643 B2
(45) Date of Patent: Jun. 21, 2016

(54) EMBEDDED DIELECTRIC AS A BARRIER IN AN ACOUSTIC DEVICE AND METHOD OF MANUFACTURE

(75) Inventors: John B. Szczech, Schaumburg, IL (US); Peter Van Kessel, Downers Grove, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/354,020

(22) PCT Filed: Nov. 4, 2011

(86) PCT No.: PCT/US2011/059318
§ 371 (c)(1),
(2), (4) Date: Apr. 24, 2014

(87) PCT Pub. No.: WO2013/066343
PCT Pub. Date: May 10, 2013

(65) Prior Publication Data
US 2014/0294209 A1    Oct. 2, 2014

(51) Int. Cl.
*H04R 25/00* (2006.01)
*H04R 17/02* (2006.01)
*B32B 15/085* (2006.01)
(Continued)

(52) U.S. Cl.
CPC ............ *H04R 17/025* (2013.01); *B32B 15/085* (2013.01); *B32B 15/16* (2013.01); *B32B 15/20* (2013.01); *H04R 1/086* (2013.01); *H04R 19/005* (2013.01); *B32B 2264/0257* (2013.01); *B32B 2307/10* (2013.01); *B32B 2307/204* (2013.01); *B32B 2307/206* (2013.01);
(Continued)

(58) Field of Classification Search
CPC ........ H04R 1/04; H04R 1/086; H04R 17/025; H04R 19/005
See application file for complete search history.

(56) References Cited

U.S. PATENT DOCUMENTS 3,192,086 A    6/1965    Gyurk
3,567,844 A    3/1971    Krcmar
(Continued)

FOREIGN PATENT DOCUMENTS

CA    2315417 A1    2/2001
DE    10303263       8/2004
(Continued)

OTHER PUBLICATIONS

U.S. Appl. No. 60/209,692, filed Jun. 6, 2000, Carpenter.
(Continued)

*Primary Examiner* — Tuan D Nguyen
(74) *Attorney, Agent, or Firm* — Foley & Lardner LLP

(57) ABSTRACT

A microphone base includes a plurality of metal layers and a plurality of core layers. Each of the plurality of core layers is disposed between selected ones of the metal layers. A dielectric membrane is disposed between other selected ones of the plurality of metal layers. A port extends through the metal layers and the core layers but not through the dielectric membrane. The dielectric membrane has a compressed portion and an uncompressed portion. The uncompressed portion extends across the port and the compressed portion is in contact with the other selected ones of the metal layers. The compressed portion of the membrane is effective to operate as a passive electronic component and the uncompressed portion is effective to act as a barrier to prevent at least some external debris from traversing through the port.

12 Claims, 5 Drawing Sheets

(51) Int. Cl.
   *B32B 15/16*   (2006.01)
   *B32B 15/20*   (2006.01)
   *H04R 1/08*   (2006.01)
   *H04R 19/00*   (2006.01)
   *H04R 1/04*   (2006.01)
   *H04R 19/04*   (2006.01)
   *H04R 31/00*   (2006.01)

(52) U.S. Cl.
   CPC .............. *B32B 2327/18* (2013.01); *H04R 1/04* (2013.01); *H04R 19/04* (2013.01); *H04R 31/006* (2013.01)

(56) References Cited

U.S. PATENT DOCUMENTS

| | | |
|---|---|---|
| 3,735,209 A | 5/1973 | Saddler |
| 3,735,211 A | 5/1973 | Kapnias |
| 4,127,840 A | 11/1978 | House |
| 4,222,277 A | 9/1980 | Kurtz et al. |
| 4,277,814 A | 7/1981 | Giachino et al. |
| 4,314,226 A | 2/1982 | Oguro et al. |
| 4,456,796 A | 6/1984 | Nakagawa et al. |
| 4,533,795 A | 8/1985 | Baumhauer et al. |
| 4,558,184 A | 12/1985 | Busch-Vishniac et al. |
| 4,628,740 A | 12/1986 | Ueda et al. |
| 4,643,935 A | 2/1987 | McNeal et al. |
| 4,691,363 A | 9/1987 | Khanna |
| 4,737,742 A | 4/1988 | Takoshima et al. |
| 4,776,019 A | 10/1988 | Miyatake |
| 4,825,335 A | 4/1989 | Wilner |
| 4,891,686 A | 1/1990 | Krausse, III |
| 4,908,805 A | 3/1990 | Sprenkels et al. |
| 4,910,840 A | 3/1990 | Sprenkels et al. |
| 4,984,268 A | 1/1991 | Brown et al. |
| 5,099,396 A | 3/1992 | Barz et al. |
| 5,101,543 A | 4/1992 | Cote et al. |
| 5,101,665 A | 4/1992 | Mizuno |
| 5,146,435 A | 9/1992 | Bernstein |
| 5,151,763 A | 9/1992 | Marek et al. |
| 5,153,379 A | 10/1992 | Guzuk et al. |
| 5,159,537 A | 10/1992 | Okano |
| 5,178,015 A | 1/1993 | Loeppert et al. |
| 5,202,652 A | 4/1993 | Tabuchi et al. |
| 5,216,278 A | 6/1993 | Lin et al. |
| 5,222,050 A | 6/1993 | Takeda |
| 5,237,235 A | 8/1993 | Cho et al. |
| 5,241,133 A | 8/1993 | Mullen, III et al. |
| 5,252,882 A | 10/1993 | Yatsuda |
| 5,257,547 A | 11/1993 | Boyer |
| 5,313,371 A | 5/1994 | Knecht et al. |
| 5,357,807 A | 10/1994 | Guckel et al. |
| 5,394,011 A | 2/1995 | Yamamoto et al. |
| 5,400,949 A | 3/1995 | Hirvonen et al. |
| 5,408,731 A | 4/1995 | Berggvist et al. |
| 5,449,909 A | 9/1995 | Kaiser et al. |
| 5,452,268 A | 9/1995 | Bernstein |
| 5,459,368 A | 10/1995 | Onishi et al. |
| 5,477,008 A | 12/1995 | Pasqualoni et al. |
| 5,490,220 A | 2/1996 | Loeppert |
| 5,506,919 A | 4/1996 | Roberts |
| 5,531,787 A | 7/1996 | Lesinski et al. |
| 5,545,912 A | 8/1996 | Ristic et al. |
| 5,592,391 A | 1/1997 | Muyshondt et al. |
| 5,593,926 A | 1/1997 | Fujihira |
| 5,611,129 A | 3/1997 | Yoshimoto et al. |
| 5,659,195 A | 8/1997 | Kaiser et al. |
| 5,712,523 A | 1/1998 | Nakashima et al. |
| 5,736,783 A | 4/1998 | Wein et al. |
| 5,740,261 A | 4/1998 | Loeppert |
| 5,748,758 A | 5/1998 | Measco, Jr. et al. |
| 5,761,053 A | 6/1998 | King et al. |
| 5,776,798 A | 7/1998 | Quan et al. |
| 5,783,748 A | 7/1998 | Otani |
| 5,789,679 A | 8/1998 | Koshimizu et al. |
| 5,818,145 A | 10/1998 | Fukiharu |
| 5,831,262 A | 11/1998 | Greywall et al. |
| 5,838,551 A | 11/1998 | Chan |
| 5,852,320 A | 12/1998 | Ichihashi |
| 5,870,482 A | 2/1999 | Loeppert et al. |
| 5,886,876 A | 3/1999 | Yamaguchi |
| 5,889,872 A | 3/1999 | Sooriakumar et al. |
| 5,895,229 A | 4/1999 | Carney et al. |
| 5,898,574 A | 4/1999 | Tan et al. |
| 5,901,046 A | 5/1999 | Ohta et al. |
| 5,923,995 A | 7/1999 | Kao et al. |
| 5,939,784 A | 8/1999 | Glenn |
| 5,939,968 A | 8/1999 | Nguyen et al. |
| 5,949,305 A | 9/1999 | Shimamura |
| 5,976,912 A | 11/1999 | Fukutomi et al. |
| 5,977,626 A | 11/1999 | Wang et al. |
| 5,981,314 A | 11/1999 | Glenn et al. |
| 5,999,821 A | 12/1999 | Kaschke |
| 6,003,381 A | 12/1999 | Kato |
| 6,012,335 A | 1/2000 | Bashir et al. |
| 6,052,464 A | 4/2000 | Harris et al. |
| 6,066,882 A | 5/2000 | Kato |
| 6,078,245 A | 6/2000 | Fritz et al. |
| 6,088,463 A | 7/2000 | Rombach et al. |
| 6,093,972 A | 7/2000 | Carney et al. |
| 6,108,184 A | 8/2000 | Minervini et al. |
| 6,117,705 A | 9/2000 | Glenn et al. |
| 6,118,881 A | 9/2000 | Quinlan et al. |
| 6,119,920 A | 9/2000 | Guthrie et al. |
| 6,136,419 A | 10/2000 | Fasano et al. |
| 6,140,144 A | 10/2000 | Najafi et al. |
| 6,147,876 A | 11/2000 | Yamaguchi et al. |
| 6,150,748 A | 11/2000 | Fukiharu |
| 6,157,546 A | 12/2000 | Petty et al. |
| 6,163,071 A | 12/2000 | Yamamura |
| 6,178,249 B1 | 1/2001 | Hietanen et al. |
| 6,191,928 B1 | 2/2001 | Rector et al. |
| 6,201,876 B1 | 3/2001 | Niemi et al. |
| 6,228,676 B1 | 5/2001 | Glenn et al. |
| 6,242,802 B1 | 6/2001 | Miles et al. |
| 6,262,477 B1 | 7/2001 | Mahulikar et al. |
| 6,282,072 B1 | 8/2001 | Minervini et al. |
| 6,282,781 B1 | 9/2001 | Gotoh et al. |
| 6,308,398 B1 | 10/2001 | Beavers |
| 6,324,067 B1 | 11/2001 | Nishiyama |
| 6,324,907 B1 | 12/2001 | Halteren et al. |
| 6,339,365 B1 | 1/2002 | Kawase et al. |
| 6,352,195 B1 | 3/2002 | Guthrie et al. |
| 6,388,887 B1 | 5/2002 | Matsumoto et al. |
| 6,401,542 B1 | 6/2002 | Kato |
| 6,403,881 B1 | 6/2002 | Hughes |
| 6,404,100 B1 | 6/2002 | Chujo et al. |
| 6,428,650 B1 | 8/2002 | Chung |
| 6,437,412 B1 | 8/2002 | Higuchi et al. |
| 6,439,869 B1 | 8/2002 | Seng et al. |
| 6,441,503 B1 | 8/2002 | Webster |
| 6,472,724 B1 | 10/2002 | Matsuzawa et al. |
| 6,479,320 B1 | 11/2002 | Gooch |
| 6,483,037 B1 | 11/2002 | Moore et al. |
| 6,521,482 B1 | 2/2003 | Hyoudo et al. |
| 6,522,762 B1 | 2/2003 | Mullenborn et al. |
| 6,526,653 B1 | 3/2003 | Glenn et al. |
| 6,534,340 B1 | 3/2003 | Karpman et al. |
| 6,552,469 B1 | 4/2003 | Pederson |
| 6,594,369 B1 | 7/2003 | Une |
| 6,621,392 B1 | 9/2003 | Volant et al. |
| 6,664,709 B2 | 12/2003 | Irie |
| 6,675,471 B1 | 1/2004 | Kimura et al. |
| 6,781,231 B2 | 8/2004 | Minervini |
| 6,859,542 B2 | 2/2005 | Johannsen et al. |
| 6,876,052 B1 | 4/2005 | Tai |
| 6,928,718 B2 | 8/2005 | Carpenter |
| 6,936,918 B2 | 8/2005 | Harney et al. |
| 6,962,829 B2 | 11/2005 | Glenn et al. |
| 7,003,127 B1 | 2/2006 | Sjursen et al. |
| 7,080,442 B2 | 7/2006 | Kawamura et al. |
| 7,092,539 B2 | 8/2006 | Sheplak et al. |
| 7,142,682 B2 | 11/2006 | Mullenborn et al. |
| 7,166,910 B2 | 1/2007 | Minervini |

(56) References Cited

U.S. PATENT DOCUMENTS

| | | | |
|---|---|---|---|
| 7,215,223 B2 | 5/2007 | Hattanda et al. | |
| 7,221,767 B2 | 5/2007 | Mullenborn et al. | |
| 7,242,089 B2 | 7/2007 | Minervini | |
| 7,280,855 B2 | 10/2007 | Hawker et al. | |
| 7,381,589 B2 | 6/2008 | Minervini | |
| 7,382,048 B2 | 6/2008 | Minervini | |
| 7,434,305 B2 | 10/2008 | Minervini | |
| 7,436,054 B2 | 10/2008 | Zhe | |
| 7,439,616 B2 | 10/2008 | Minervini | |
| 7,501,703 B2 | 3/2009 | Minervini | |
| 7,537,964 B2 | 5/2009 | Minervini | |
| RE40,781 E | 6/2009 | Johannsen et al. | |
| 7,633,156 B2 | 12/2009 | Minervini | |
| 7,927,927 B2 | 4/2011 | Quan et al. | |
| 8,018,049 B2 | 9/2011 | Minervini | |
| 8,103,025 B2 | 1/2012 | Mullenborn et al. | |
| 8,121,331 B2 | 2/2012 | Minervini | |
| 8,170,244 B2 | 5/2012 | Ryan | |
| 8,358,004 B2 | 1/2013 | Minervini | |
| 8,450,817 B2 | 5/2013 | Minervini | |
| 8,526,665 B2 | 9/2013 | Lutz | |
| 8,532,323 B2 | 9/2013 | Wickstrom et al. | |
| 8,594,347 B2 | 11/2013 | Ryan | |
| 8,624,384 B1 | 1/2014 | Minervini | |
| 8,624,385 B1 | 1/2014 | Minervini | |
| 8,624,386 B1 | 1/2014 | Minervini | |
| 8,624,387 B1 | 1/2014 | Minervini | |
| 8,629,551 B1 | 1/2014 | Minervini | |
| 8,629,552 B1 | 1/2014 | Minervini | |
| 8,704,360 B1 | 4/2014 | Minervini | |
| 8,781,140 B2 | 7/2014 | Lautenschlager | |
| 8,791,531 B2 | 7/2014 | Loeppert | |
| 8,879,767 B2 | 11/2014 | Wickstrom | |
| 8,969,980 B2 | 3/2015 | Lee | |
| 8,983,105 B2 | 3/2015 | Reining | |
| 8,995,694 B2 | 3/2015 | Vos | |
| 9,006,880 B1 | 4/2015 | Minervini | |
| 9,023,689 B1 | 5/2015 | Minervini | |
| 9,024,432 B1 | 5/2015 | Minervini | |
| 9,051,171 B1 | 6/2015 | Minervini | |
| 9,078,063 B2 | 7/2015 | Loeppert | |
| 9,078,064 B2 | 7/2015 | Wickstrom et al. | |
| 9,137,595 B2 | 9/2015 | Lee | |
| 9,139,421 B1 | 9/2015 | Minervini | |
| 9,139,422 B1 | 9/2015 | Minervini | |
| 9,148,731 B1 | 9/2015 | Minervini | |
| 2002/0067663 A1 | 6/2002 | Loeppert et al. | |
| 2002/0102004 A1 | 8/2002 | Minervini | |
| 2003/0052404 A1 | 3/2003 | Thomas | |
| 2003/0133588 A1 | 7/2003 | Pedersen | |
| 2004/0032705 A1 | 2/2004 | Marek et al. | |
| 2004/0184632 A1 | 9/2004 | Minervini | |
| 2005/0018864 A1* | 1/2005 | Minervini | B81B 7/0061 381/175 |
| 2005/0069164 A1 | 3/2005 | Muthuswamy et al. | |
| 2005/0185812 A1 | 8/2005 | Minervini | |
| 2005/0218488 A1 | 10/2005 | Matsuo | |
| 2006/0157841 A1 | 7/2006 | Minervini | |
| 2007/0189568 A1 | 8/2007 | Wilk et al. | |
| 2007/0215962 A1 | 9/2007 | Minervini | |
| 2008/0170727 A1 | 7/2008 | Bachman et al. | |
| 2008/0217709 A1 | 9/2008 | Minervini | |
| 2008/0247585 A1 | 10/2008 | Leidl et al. | |
| 2009/0016550 A1 | 1/2009 | Qiao | |
| 2009/0080682 A1 | 3/2009 | Ogura et al. | |
| 2010/0246877 A1 | 9/2010 | Wang et al. | |
| 2011/0096945 A1 | 4/2011 | Furst et al. | |
| 2012/0039499 A1 | 2/2012 | Ryan | |
| 2012/0319174 A1* | 12/2012 | Wang | B81C 1/00246 257/254 |
| 2013/0108074 A1 | 5/2013 | Reining | |
| 2013/0177192 A1 | 7/2013 | Abry | |
| 2014/0037115 A1 | 2/2014 | Vos | |
| 2014/0037120 A1 | 2/2014 | Lim | |
| 2014/0037124 A1 | 2/2014 | Lim | |
| 2014/0064546 A1 | 3/2014 | Szczech | |
| 2014/0117681 A1 | 5/2014 | Jenkins | |
| 2014/0133686 A1 | 5/2014 | Lee | |
| 2014/0239352 A1* | 8/2014 | Wang | H04R 19/04 257/254 |
| 2014/0291783 A1 | 10/2014 | Talag | |
| 2014/0291784 A1 | 10/2014 | Conklin | |
| 2014/0294209 A1 | 10/2014 | Szczech | |
| 2014/0321687 A1 | 10/2014 | Friel | |
| 2015/0041931 A1 | 2/2015 | Szczech | |
| 2015/0139428 A1 | 5/2015 | Reining | |
| 2015/0172825 A1 | 6/2015 | Lim | |
| 2015/0195659 A1 | 7/2015 | Szczech | |
| 2015/0208165 A1 | 7/2015 | Volk | |
| 2015/0251898 A1 | 9/2015 | Vos | |

FOREIGN PATENT DOCUMENTS

| | | | |
|---|---|---|---|
| DE | 112010006098 | | 3/2014 |
| EP | 0 077 615 | A1 | 4/1983 |
| EP | 0 534 251 | A1 | 3/1993 |
| EP | 0 682 408 | A1 | 11/1995 |
| EP | 0 774 888 | A2 | 5/1997 |
| EP | 1346601 | | 5/2011 |
| FI | 981413 | A | 12/1999 |
| JP | 63275926 | | 11/1988 |
| JP | 01169333 | | 7/1989 |
| JP | 07-099420 | | 4/1995 |
| JP | 09-107192 | | 4/1997 |
| JP | 09-306934 | A | 11/1997 |
| JP | 09-318650 | | 12/1997 |
| JP | 10-062282 | A | 3/1998 |
| JP | 2000-165999 | A | 6/2000 |
| JP | 2000-199725 | A | 7/2000 |
| JP | 2000-277970 | A | 10/2000 |
| JP | 2000-316042 | | 11/2000 |
| JP | 2000-340687 | A | 12/2000 |
| JP | 2001-102469 | A | 4/2001 |
| JP | 2001-308217 | A | 11/2001 |
| JP | 2002-324873 | A | 11/2002 |
| JP | 2002-334951 | A | 11/2002 |
| JP | 2005-235377 | A | 9/2005 |
| JP | 2006-283561 | A | 10/2006 |
| WO | 90/11006 | A1 | 9/1990 |
| WO | 00/42636 | A2 | 7/2000 |
| WO | 01/19133 | A1 | 3/2001 |
| WO | 01/20948 | A2 | 3/2001 |
| WO | 01/41497 | A1 | 6/2001 |
| WO | 02/15636 | A2 | 2/2002 |
| WO | 02/45463 | A2 | 6/2002 |
| WO | 2006/020478 | A1 | 2/2006 |
| WO | 2006/061058 | A1 | 6/2006 |

OTHER PUBLICATIONS

U.S. Appl. No. 60/450,569, filed Feb. 28, 2003, Minervini.
U.S. Appl. No. 09/886,854, filed Jun. 21, 2001, Minervini.
U.S. Appl. No. 10/921,747, filed Aug. 19, 2004, Minervini.
U.S. Appl. No. 60/253,543, filed Nov. 29, 2000, Minervini.
U.S. Appl. No. 11/741,881, filed Apr. 30, 2007, Minervini.
Grieg, William, "Integrated Circuit Packaging, Assembly and Interconnections" (2007).
"Pressure Transducer Handbook," pp. 4-2 to 4-5, 12-1 to 12-5, National Semiconductor Corp., USA (1977).
Rosenberger, M.E., "Absolute Pressure Transducer for Turbo Application", pp. 77-79 (1983).
Smith, K., An Inexpensive High Frequency High Power VLSI Chip Carrier, IEPS.
Card, D., How ETA Chose to Make a Megaboard for its Supercomputer, pp. 50-52, Electron. Bus. (1988).
Speerschneider, C.F. et al., "Solder Bump Reflow Tape Automated Bonding", pp. 7-12, Proceedings 2nd ASM International Electronic Materials and Processing Congress (1989).
Tummala and Rymaszewski, "Microelectronics Packaging Handbook" (1989).
Minges, Merrill, L., "Electronics Materials Handbook, vol. 1 Packaging" (1989).

(56) References Cited

OTHER PUBLICATIONS

Pecht, Michael G., "Handbook of Electronic Package Design" (1991).
Petersen, Kurt et al., "Silicon Accelerometer Family; Manufactured for Automotive Applications" (1992).
Gilleo, Ken, "Handbook of Flexible Circuits" (1992).
Scheeper, P.R. et al., "A Review of Silicon Microphones", Sensor and Actuators Actuators, A 44, pp. 1-11 (1994).
Lau, John, ed., "Ball Grid Array Technology", McGraw Hill, Inc., USA (1995).
Khadpe, S., "Worldwide Activities in Flip Chip, BGA and TAB Technologies and Markets", pp. 290-293, Proceedings 1995 International Flip Chip, Ball Grid Array, TAB and Advanced Packaging Symposium (1995).
Alvarez, E. and Amkor Technology, Inc., "CABGA Optional Process Description" (Apr. 1997).
Dizon, C. and Amkor Technology, Inc., "CABGA Control Plan" (Dec. 1997).
Bever, T. et al., "BICMOS Compatible Silicon Microphone Packaged as Surface Mount Device", Sensors Expo (1999).
Torkkeli, Altti et al., "Capacitive Silicon Microphone," Physica Scripta vol. T79, pp. 275-278 (1999).
Pecht et al., "Electronic Packaging Materials and their Properties" (1999).
Premachandran, C.S. et al,, "Si-based Microphone Testing Methodology and Noise Reduction," Proceedings of SPIE, vol. 4019 (2000).
Torkkeli, Altti et al., "Capacitive microphone with low-stress polysilicon membrane and high-stress polysilicon backplate," Sensors and Actuators (2000).
"Harper, Charles ed., McGraw Hill, "Electronic Packaging and Interconnection Handbook" (2000)".
JEDEC Standard Terms, Definitions, and Letter Symbols for Microelectronic Devices (2000).
Institute of Electrical and Electronics Engineers, IEEE 100 the Authoritative Dictionary of IEEE Standards Terms Seventh Edition (2000).
Arnold, David Patrick, "A MEMS-Based Directional Acoustic Array for Aeoacoustic Measurements," Master's Thesis, University of Florida (2001).
Henning, Albert K. et al., "Microfluidic MEMS for Semiconductor Processing," IEEE Transaction on Components, Packaging, & Mfg. Tech., Part B, pp. 329-337, vol. 21, No. 4 (Nov. 1998).
Giasolli, Robert, "MEMS Packaging Introduction" (Nov. 2000).
Gale, Bruce K., "MEMS Packaging," Microsystems Principles (Oct. 2001).
Amkor Technology, Inc., "Control Plan—CABGA" (Apr. 2012).
Puttlitz & Totta, "Area Array Interconnection Handbook" (2001).
International Search Report for Application No. PCT/US05/021276 (Oct. 21, 2005).
European Search Report for Application No. 07702957.4 (Jul. 19, 2007).
Chung, K., et al., "Z-Axis Conductive Adhesives for Fine Pitch Interconnections", ISHM Proceedings, pp. 678-689 (1992).
Masuda, N., IEEE/CHMT Japan IEMT Symposium, pp. 55-58, (1989).
Kristiansen, H. et al., "Fine Pitch Connection of Flexible Circuits to Rigid Substrates Using Non-Conductive Epoxy Adhesive", IEPS, pp. 759-773 (1991).
Sakuma, K., et al., "Chip on Glass Technology with Standard Aluminized IC Chip", ISHM, pp. 250-256 (1990).
Katopis, G.A., "Delta-I Noise Specification for a High Performance Computing 'Machine'", Proc. IEEE, pp. 1405-1415 (1985).
Davis, E.M., et al., "Solid Logic Technology: Versatile High-Performance Microelectronics", IBM J. Res. Devel., 8(2), pp. 102-114 (1964).
Lloyd, R.H.F., "ASLT: An Extension of Hybrid-Miniaturization Techniques", IBM J. Res. Develop.,11(4), pp. 86-92 (1967).
Fox, P.E,. et al., "Design of Logic-Circuit Technology for IBM System 370 Models 145 and 155", IBM J. Res. Devel. 15(2), pp. 384-390 (1971).

Gedney, R.W., "Trends in Packaging Technology",16th Annual Proceedings of Reliability Physics, pp. 127-129 (1978).
Schwartz, B. et al., "Ceramics and the Micromodule", RCA Eng., 5(4), p. 56-58 (1960).
Lomeson, .R.B, "High Technology Microcircuit Packaging", International Electronic Packaging Society Proceedings, pp. 498-503 (1982).
Balde, J.W., "Status and Prospects of Surface Mount Technology", Solid State Technol., 29(6), pp. 99-103 (1986).
Lau, John, "Chip Scale Package Design, Materials, Process, Reliability, and Applications", McGraw-Hill(1999).
Notice of Investigation, Inv. No. 337-TA-629, in the Matter of "Certain Silicon Microphone Packages and Products Containing the Same", United States International Trade Commission, issued Jan. 3, 2008.
Arnold, David P. et al., "MEMS-Based Acoustic Array Technology," 40th AIAA Aerospace Sciences Meeting & Exhibit, Jan. 14-17, 2000, American Institute of Aeronautics and Astronautics, Reston, Virginia.
Kress, H.J. et al, "Integrated Silicon Pressure Sensor for Automotive Application with Electronic Trimming," SAE International, International Congress and Exposition, Detroit, Michigan (Feb. 27, 1995-Mar. 2, 1995).
Wiley Electrical and Electronics Engineering Dictionary, p. 275, IEEE Press (2004).
Initial Determination on Violation of Section 337 and Recommended Determination on Remedy and Bond, In the Matter of Certain Silicon Microphone Packages and Products Containing the Same, ITC Inv. No. 337-TA-695 (Nov. 22, 2010).
Notice of Commission Determination to Review in Part an Initial Determination, In the Matter of Certain Silicon Microphone Packages and Products Containing the Same, ITC Inv. No. 337-TA-695 (Jan. 21, 2011).
Initial Determination on Violation of Section 337 and Recommended Determination on Remedy and Bond, In the Matter of Certain Silicon Microphone Packages and Products Containing the Same, ITC Inv. No. 337-TA-629 (Jan. 12, 2009).
Commission Opinion, In the Matter of Certain Silicon Microphone Packages and Products Containing the Same, ITC Inv. No. 337-TA-629 (Aug. 18, 2009).
Federal Circuit Court of Appeals Opinion, *MEMS Technology Berhad* v *International Trade Commission and Knowles Electronics LLC*, Case No. 2010-1018 (Jun. 3, 2011).
Initial Determination Terminating Investigation Based on Settlement Agreement, In the Matter of Certain Silicon Microphone Packages and Products Containing the Same, ITC Inv. No. 337-TA-825 (Mar. 12, 2013).
Joint Stipulation of Dismissal, *Knowles Electronics, LLC* v. *Analog Devices, Inc.*, United States District Court for the Northern District of Illinois, Civil Action No. 1:11-cv-06804 (Mar. 12, 2013).
Notification of Docket Entry, *Knowles Electronics, LLC* v. *Analog Devices, Inc.*, United States District Court for the Northern District of Illinois, Civil Action No. 1:11-cv-06804 (Mar. 13, 2013).
Notice of a Commission Determination Not to Review an Initial Determination Terminating Investigation Based on a Settlement Agreement; Termination of the Investigation, In the Matter of Certain Silicon Microphone Packages and Products Containing the Same, ITC Inv. No. 337-TA-825 (Apr. 8, 2013).
Corrected Conditional Rebuttal Expert Report of Wilmer Bottoms Regarding Validity, Public Version, In the Matter of Certain Silicon Microphone Packages and Products Containing the Same, ITC Inv. No. 337-TA-825 (Mar. 7, 2013).
Initial Post-Hearing Brief of Complainant Knowles Electronics, LLC, Public Version, In the Matter of Certain Silicon Microphone Packages and Products Containing the Same, ITC Inv. No. 337-TA-825 (Mar. 7, 2013).
Reply Post-Hearing Brief of Complainant Knowles Electronics, LLC, Public Version, In the Matter of Certain Silicon Microphone Packages and Products Containing the Same, ITC Inv. No. 337-TA-825 (Mar. 7, 2013).
Expert Report of Prof. Michael G. Pecht, Public Version, In the Matter of Certain Silicon Microphone Packages and Products Containing the Same, ITC Inv. No. 337-TA-825 (Mar. 7, 2013).

(56) References Cited

OTHER PUBLICATIONS

Initial Post-Hearing Brief of Respondents Analog Devices, Inc., Amkor Technology, Inc. & Avnet, Inc., Public Version, In the Matter of Certain Silicon Microphone Packages and Products Containing the Same, ITC Inv. No. 337-TA-825 (Mar. 7, 2013).
Reply Post-Hearing Brief of Respondents Analog Devices, Inc., Amkor Technology, Inc. & Avnet, Inc., Public Version, In the Matter of Certain Silicon Microphone Packages and Products Containing the Same, ITC Inv. No. 337-TA-825 (Mar. 7, 2013).
Opinion and Order, Motion for Reconsideration of the Court's Claim Construction Ruling, *Knowles Electronics, LLC* v. *Analog Devices, Inc.*, United States District Court for the Northern District of Illinois, Civil Action No. 1:11-cv-06804 (Feb. 19, 2013).
Rulings on Claim Construction, *Knowles Electronics, LLC* v. *Analog Devices, Inc.*, United States District Court for the Northern District of Illinois, Civil Action No. 1:11-cv-06804 (May 30, 2012).
Opinion and Order, Motion for Partial Summary Judgment, *Knowles Electronics, LLC* v. *Analog Devices, Inc.*, United States District Court for the Northern District of Illinois, Civil Action No. 1:11-cv-06804 (Mar. 7, 2013).
A. Dehe et al., *Silicon Micromachined Microphone Chip at Siemens*, 137th Regular Meeting of the Acoustical Society of America, Mar. 16, 1999, US.
A. J. Sprenkels, J.A. Voorthuryzen, and P. Bergveld, "A theoretical analysis of the electric airgap field-effect structure for sensors applications," 1986, US.
A.J. Sprenkels, W. Olthius, and P. Bergveld, "The application of silicon dioxide as an elecret materials", Proc. 6th Int. Symp. Electrets, ISE 6, p. 164-169, 1988, UK.
E.H. Pederson et al., "Flip-Chip Hermetic Packaging for MEMS", Proceedings of Eurosensors XIV, Copenhagen, Denmark, Aug. 27-30, 2000 US.
J.A. Voorthuyzen and P. Bergveld, "Semiconductor-based electret sensor for sound and pressure", IEEE Trans. Dielect, Elect. Insulation, 1989, p. 267-276.
J.A. Voorthuyzen and P. Bergveld, "The PRESSFET: An integrated electret-MOSFET based pressure sensor", Sens Actuators, 1988, p. 349-360.
Joint Electron Device Engineering Council, "JEDEC Standard, Descriptive Designation System for Semiconductor-Device Packages, JESD30-B, Elec. Indus. Ass'n" Apr. 1995, US.
Kourosh Amiri Jam et al., "Design Methodology of Modular Microsystems", Mar. 29, 2001, Germany.
M. Schuenemann et al., "A highly flexible design and production framework for modularized microelectromechanical systems", Oct. 7, 1998, pp. 153-168.

Malshe et al., "Challenges in the Packaging of MEMS", 1999, p. 41-47, US.
Pecht et al., *Plastic-Encapsulated Microelectronics*, 1995, p. 460, US.
Prasad, Ray P., "Surface Mount Technology: Principles and Practices" 2nd Edition, 1997, p. 3-50, 129-135, 149-203, 339-597, 747-757, US.
Tummala, Rao R., "Microelectronics Packaging Handbook: Semiconductor Packaging Part II", 1997, pp. 1-42; Ch. 7 p. 11-3 to 11-128; Ch. 8.3 p. 11-136 to 11-185; Ch. 9 p. 11-284 to 11-393; Section 11.5 p. 11-516 to 11-527; Section 11.6 p. 11-528 to 11-533; Ch. 14 p. 11-873 to 11-927; Glossary pp. 11-931 to 11-976, USA.
Tummala, Rao R., "Fundamentals of Microsystems Packaging", 2001, p. 2-42, 65-68, 81-119, 120-183, 265-294, 297-340, 543-578, 580-610, 659-693, 695-747, 678-682, 924-944, US.
Respondents' Notice of Prior Art, In the Matter of Certain Silicon Microphone Packages and Products Containing the Same, ITC Inv. No. 337-TA-888 (Oct. 23, 2013).
Construing Terms of Asserted Claims of Patents at Issue & Denying Complainants' Motion to Supplement Its Proposed Claim Constructions, Inv. No. 337-TA-888, U.S. Int'l Trade Commission, Apr. 15, 2014.
Respondents Goertek, Inc.'s, and Goertek Electronics, Inc.'s Petition for Review of Initial and Recommended Determinations, Inv. No. 337-TA-888, U.S. Int'l Trade Commission, Sep. 17, 2014.
Respondents Goertek, Inc.'s, and Goertek Electronics, Inc.'s Response to Complainant Knowles Electronics LLC's Contingent Petition for Review of Final Initial Determination, Inv. No. 337-TA-888, U.S. Int'l Trade Commission, Sep. 29, 2014.
Complainant Knowles Electronics, LLC's Contingent Petition for Review of Final Initial Determination, Inv. No. 337-TA-888, U.S. Int'l Trade Commission, Sep. 17, 2014.
Complainant Knowles Electronics, LLC's Response to Petition for Review of Respondents Goertek Inc. and Goertek Electronics, Inc., Inv. No. 337-TA-888, U.S. Int'l Trade Commission, Sep. 29, 2014.
Complainant Knowles Electronics, LLC's Statement on the Public Interest Pursuant to 19 C.F.R. § 210.50(a)(4), Inv. No. 337-TA-888, U.S. Int'l Trade Commission, Oct. 2, 2014.
Summary of Complainant Knowles Electronics, LLC's Response to Petition for Review of Respondents Goertek Inc. and Goertek Electronics, Inc., Inv. No. 337-TA-888, U.S. Int'l Trade Commission, Sep. 29, 2014.
Notice Regarding Issuance of Public Version of Final Initial Determination and Recommended Determination on Remedy and Bond, Inv. No. 337-TA-888, U.S. Int'l Trade Commission, Oct. 15, 2014.
International Search Report and Written Opinion issued in PCT/US2011/059318 on Apr. 25, 2012, 9 pages.

\* cited by examiner

Proposed Microphone Base Stack-up.

| LAYER | | DESCRIPTION | MATERIAL |
|---|---|---|---|
| TOP | | FINISH | GOLD |
| | | FINISH | NICKEL |
| | 1 | TOP SOLDER MASK | SOLDER MASK |
| | | METAL PLATING | COPPER |
| | | TOP BASE METAL | COPPER |
| | C1 | PREPREG/CORE | FR-4 |
| | 2 | METAL CLAD | COPPER |
| | | ADHESIVE | LAMINATING FILM |
| | D | DIELECTRIC/BARRIER | ePTFE |
| | | ADHESIVE | LAMINATING FILM |
| | 3 | METAL CLAD | COPPER |
| | C2 | PREPREG/CORE | FR-4 |
| | 4 | BOTTOM BASE METAL | COPPER |
| | | METAL PLATING | COPPER |
| | | BOTTOM SOLDER MASK | SOLDER MASK |
| | | FINISH | NICKEL |
| BOTTOM | | FINISH | GOLD |

FIG. 4

EMBEDDED DIELECTRIC AS A BARRIER IN AN ACOUSTIC DEVICE AND METHOD OF MANUFACTURE

CROSS-REFERENCE TO RELATED APPLICATIONS

This application is a U.S. national phase application of International Application No. PCT/US2011/059318, filed Nov. 4, 2011, designating the United States, which is hereby incorporated herein by reference in its entirety.

TECHNICAL FIELD

This application relates to acoustic devices and, more specifically, to the construction of these devices.

BACKGROUND OF THE INVENTION

Various types of acoustic devices (e.g., microphones and receivers) have been used through the years. In these devices, different electrical components are housed together within a housing or assembly. For example, a microphone typically includes a diaphragm and a back plate (among other components) and these components are disposed together within a housing. Other types of acoustic devices such as receivers may include other types of components.

Acoustic devices typically have ports that allow sound to enter into the interior (or exit from the interior) of the housing. For example, a microphone may have a port that allows sound from the exterior to enter and be amplified. In another example, a speaker typically includes a port that allows sound to exit from the interior of the housing. Regardless of the direction of sound travel, one problem associated with the ports is that while they allow the sound to enter (or exit) the device, they also potentially allow debris inside the interior of the acoustic device. For example, if used in a hearing aid, ear wax or other type of debris may be allowed to enter the device by a port. Besides solid debris, various types of liquids can also be allowed to enter into the interior of the device. All of these types of materials can potentially damage the acoustic device and/or adversely impact its operation.

Previous systems have sometimes used barriers over the port to prevent debris or other foreign materials from entering the interiors of acoustic devices via the ports. In one previous example, a metal screen was disposed over the port. Unfortunately, the metal screen added air flow resistance to the acoustic device. The adding of the air flow resistance degraded the performance of the device creating user dissatisfaction with these previous systems.

BRIEF DESCRIPTION OF THE DRAWINGS

For a more complete understanding of the disclosure, reference should be made to the following detailed description and accompanying drawings wherein:

FIG. 4 comprises a table showing the various layers of a microphone base according to various embodiments of the present invention;

Figure 1:
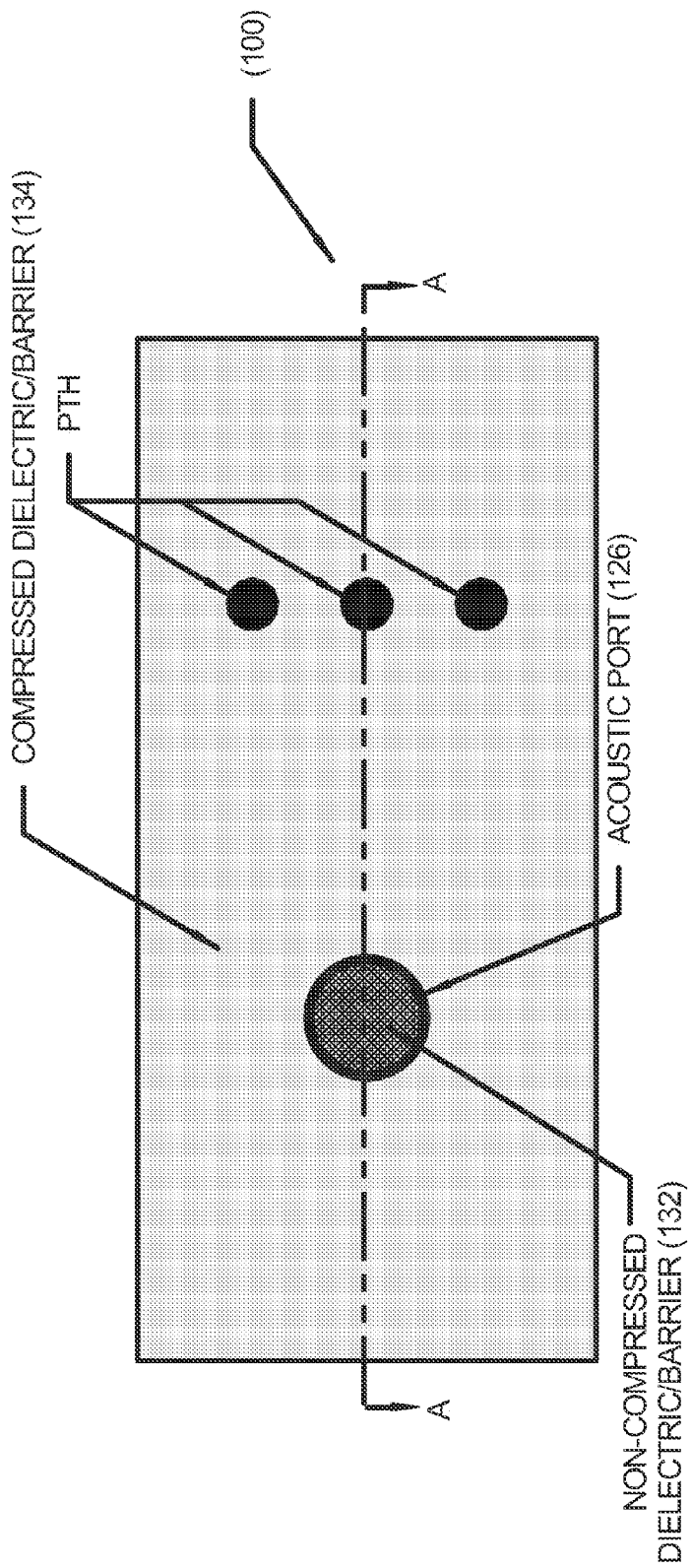
FIG. 1 comprises a bottom view of a dielectric membrane layer according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Acoustic devices having a membrane that acts as both a dielectric layer and an ingress barrier are provided. The devices so configured are manufacturable and prevent outside materials from entering the device while at the same time not increasing or substantially increasing acoustic resistance of the device. Additionally, the devices described herein provide a dielectric layer for passive electric components such as capacitors In one aspect, the base (or circuit board or substrate) of an acoustic device such as a microphone includes multiple layers of various materials. The layers include at least some metal layers and at least some core layers. A dielectric membrane is sandwiched between some of these layers. A port extends through the layers, but the dielectric membrane extends across the port. A portion of the dielectric membrane is compressed and this compressed portion can be used as a capacitor. The non-compressed across the port acts as a barrier. The dielectric membrane is constructed of any suitable material such as expanded polytetrafluoroethylene (ePTFE) or other polymeric membrane. Other examples of materials are possible. The dielectric membrane provides little acoustic resistance to sound entering (or exiting) the device provided an appropriately sized (e.g., greater than approximately 1.0 mm diameter) port is used.

The compressed part of the dielectric membrane has an increased dielectric constant that is sufficient for this portion to act as a capacitor. Consequently, a single dielectric membrane acts as both a barrier and a passive electric component. Further, there is enough acoustic/sound flow so that the dielectric membrane does not act as an acoustic resistor.

In many of these embodiments, a microphone base includes a plurality of metal layers and a plurality of core layers. Each of the plurality of core layers is disposed between selected ones of the metal layers. A dielectric membrane is disposed between other selected ones of the plurality of metal layers. A port extends through the metal layers and the core layers but not through the dielectric membrane. The dielectric membrane has a compressed portion and an uncompressed portion. The uncompressed portion extends across the port and the compressed portion is in contact with the other selected ones of the metal layers. The compressed portion of the membrane is effective to operate as a passive electronic component and the uncompressed portion is effective to act as a barrier to prevent at least some external debris from traversing through the port.

Figure 2:
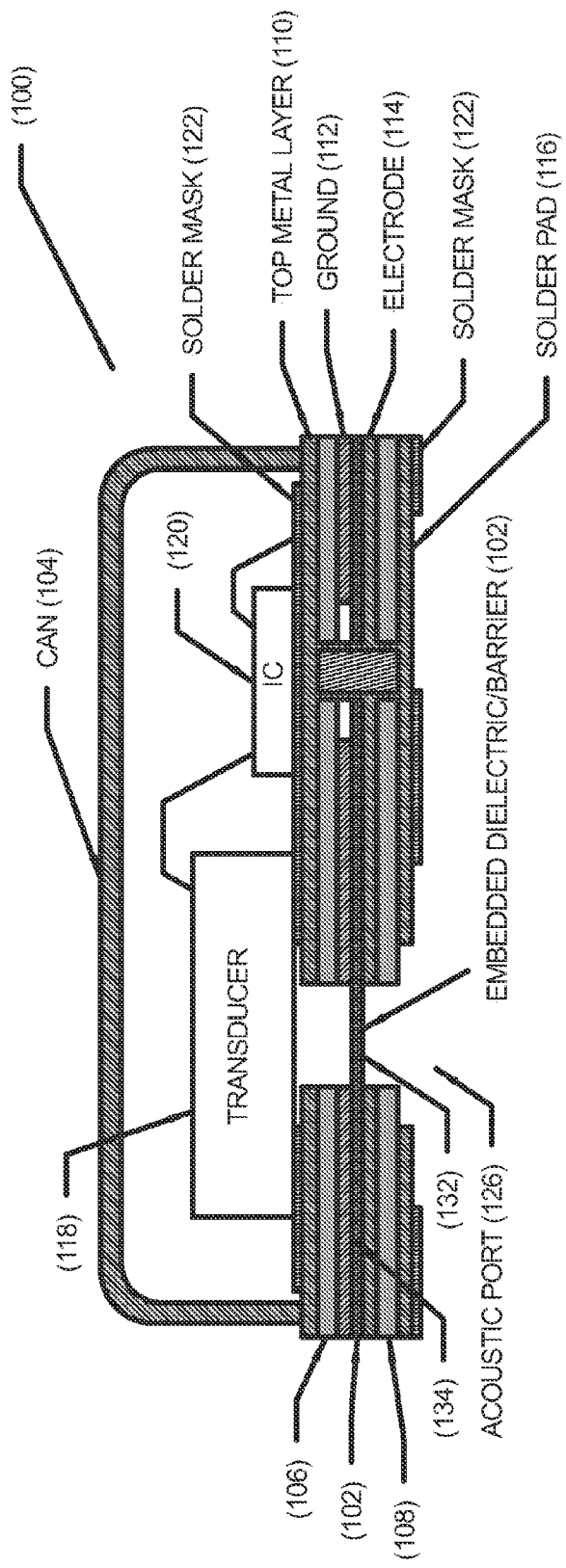
FIG. 2 comprises a side cut-away view of an acoustic device with the dielectric membrane layer of FIG. 1 along the line denoted A-A according to various embodiments of the present invention.

Referring now to FIG. 1 and FIG. 2, one example of an acoustic device 100 with a dielectric membrane 102 is described. The device 100 includes a cover or can 104, a dielectric membrane 102, a first core layer 106, a second core layer 108, a first metal layer 110, a second metal layer 112, a third metal layer 114, a fourth metal layer 116, a transducer 118, an integrated circuit 120, a solder mask 122, solder pads 124, and an acoustic port 126.

The cover or can 104 is constructed of any appropriate material such as a metal or hard plastic. The dielectric membrane 102 includes a non-compressed area 132 and a compressed area 134. The compressed area 134 is generally located where the dielectric layer 102 is directly sandwiched between other adjoining layers (i.e., is in contact with these adjoining layers). The uncompressed area 132 is generally located where the dielectric layer 102 extends across the port 126 (i.e., where the layer 102 is not in direct contact with adjoining layers). The compression of the layer 102 (by having it squeezed and held between adjoining layers) changes the dielectric constant value of the compressed area, increasing it as compared with the uncompressed area and thereby makes the dielectric suitable for use as a capacitor. The electrodes of the capacitor are electrically connected vertically to the appropriate metal layers and traces by plated through hole vias.

Figure 3:
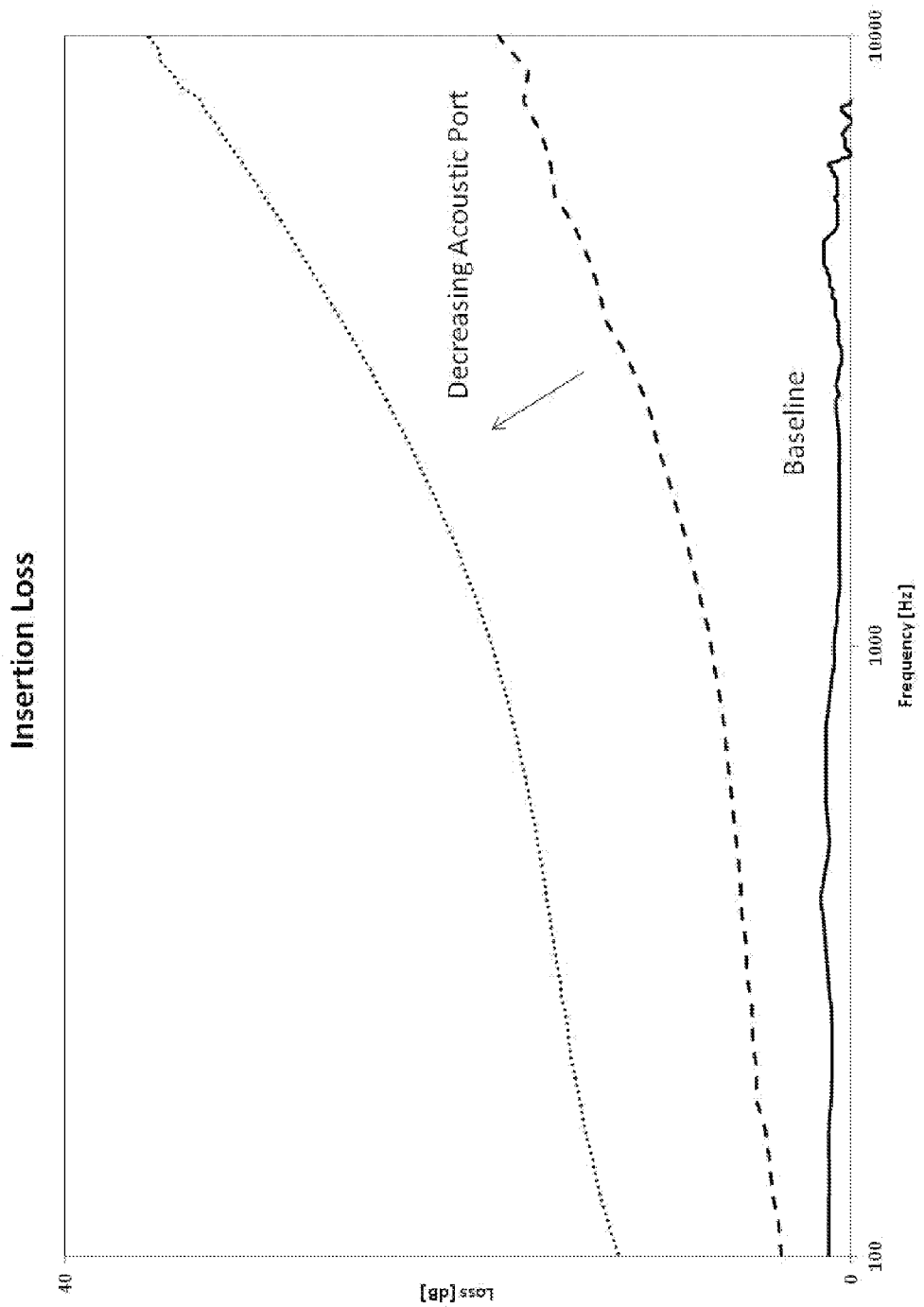
FIG. 3 comprises a diagram showing insertion loss of one type of expanded polytetrafluoroethylene (ePTFE) material according to various embodiments of the present invention.

In one example, the layer 102 is an expanded Teflon expanded polytetrafluoroethylene (ePTFE) film. The film is relatively acoustically transparent due to its low density (e.g., >70 percent volume is air). Referring now to FIG. 3, the insertion loss (permeability of sound) of two types of ePTFE is shown for two ePTFE films (NTF 1026 and NTF 1033).

The first core layer 106 and a second core layer 108 are constructed from glass reinforced laminate in one example. The purpose of the core layers 106 and 108 provide mechanical rigidity and electrical insulation between the metal layers.

The first metal layer 110, second metal layer 112, third metal layer 114, and fourth metal layer 116 are constructed from an appropriate metal such as copper. The purpose of these layers is to provide conductive paths and routing functions. For instance, the layer 110 may be a routing and wire bond layer. The layer 112 may be a common capacitive ground. The layer 114 may be used for signal electrodes. The layer 116 may be used for customer pads. As shown in FIG. 4, one example of a proposed microphone base metal stack up is shown. There are two core layers (C1 and C2) and four metal layers (1, 2, 3, and 4) and the dielectric layer (D). The composition (description), thickness, tolerance, and other information of these layers is included. As shown, the metal layers are constructed of sub-portions. The layers together may be referred to as the microphone base (or circuit board). It will be appreciated that the example base described herein is only one example and that the number, type, configuration, materials, and other aspects of the base can be changed depending upon the needs of a particular user or the requirements of a particular system.

As a capacitor, the inherent low dielectric constant (k=1.3) of the layer 102 constructed of uncompressed ePTFE would likely present problems for obtaining a useful capacitor. In some aspects, uncompressed ePTFE provides approximately only 10 percent of the capacitance per unit area as embedded dielectric films. However, because of the compressive nature of ePTFE, it can be compacted to near bulk density during the lamination process (except for material at the acoustic port hole which remains uncompressed) to yield a capacitance per unit area of approximately 20 percent of current materials.

The transducer 118 includes various components such as a MEMS die, diaphragm, charge plate and so forth. The transducer acts to convert sound energy into an electrical signal that is sent to the integrated circuit 120. The function of the solder mask 122 is to protect and insulate the underlying metal traces and to prevent solder migration. The solder pads 116 provide an electrical and mechanical connection between the base and the final PCB assembly.

In one example of the operation of the system of FIG. 1 and FIG. 2, the compressed part 132 of the dielectric membrane 102 has an increased dielectric constant that is sufficient for this portion to act as a capacitor while the uncompressed part 134 acts as a barrier in the port 126. Consequently, the single dielectric membrane 102 acts as both a barrier and a passive electric component. Further, there is enough acoustic/sound flow so that the dielectric membrane 102 does not act as an acoustic resistor and therefore there is little or no adverse impact upon the operation of the device 100.

Figure 5:
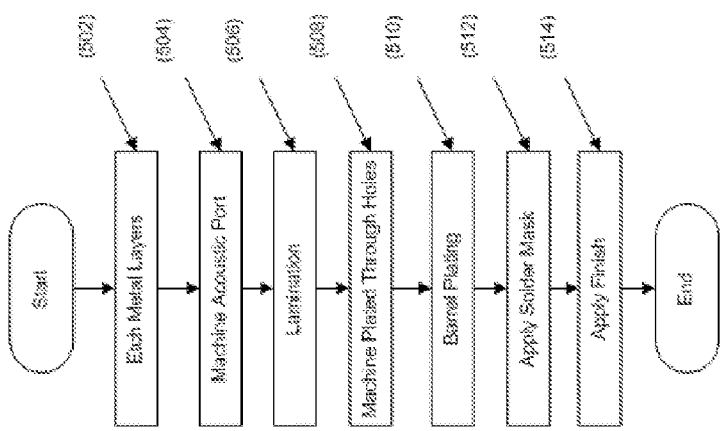
FIG. 5 comprises a flowchart for creating a microphone base according to various embodiments of the present invention.

Referring now to FIG. 5, one example of a process for creating the microphone base is described. At step 502, metallization layers are etched onto both the top and bottom cores. At step 504, a mechanical drill is used to bore an acoustic port hole through the top and bottom cores. At step 506, a lamination is performed of the ePTFE film between the top and bottom cores. This results in a multi-layer PCB with an embedded dielectric and barrier.

At step 508, a mechanical drill is used to bore a plated through hole (PTH) vias, which are used to electrically connect the metal traces and layers. At step 510, a copper barrel plate is applied to the board. The purpose of copper barrel plating is to coat the inner walls of the vias in order to make them electrically conductive in the axial direction. At step 512, the top and bottom solder masks are printed and then cured. At step 514, ENIG finish is applied to provide a corrosion resistant and wire bondable and solderable surface.

Accordingly, approaches are provided using ePTFE or other similar materials as both ingress barriers and passive electrical components in acoustic devices such as microphones. Fluoropolymer-based films (such as ePTFE) can be embedded according to the present approaches into a multi-layer base directly contrary to previous approaches where this aspect was avoided. Additionally, counter intuitively, and in stark contrast to previous approaches, ePTFE materials of the present approaches are used in passive electrical components to provide the various advantages described herein.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A microphone base, the base comprising:
a plurality of metal layers;
a plurality of core layers, each of the plurality of core layers being disposed between selected ones of the metal layers;
a dielectric membrane disposed between other selected ones of the plurality of metal layers;
a port that extends through the metal layers and the core layers but not through the dielectric membrane;
such that the dielectric membrane has a compressed portion and an uncompressed portion, the uncompressed portion extending across the port and the compressed portion being in contact with the other selected ones of the metal layers;
such that the compressed portion of the membrane is effective to operate as a passive electronic component and the uncompressed portion is effective to act as a barrier to prevent at least some external debris from traversing through the port.

2. The base of claim 1 wherein the dielectric constant value of the compressed portion is different than the dielectric constant value of the uncompressed portion.

3. The base of claim 1 wherein the membrane comprises an expanded Teflon expanded polytetrafluoroethylene (ePTFE) film.

4. The base of claim 1 wherein the electronic component comprises a capacitor.

5. The base of claim 1 wherein the port has a diameter greater than approximately 1.0 mm.

6. A microphone comprising:
a base, the base comprising:
a plurality of metal layers;
a plurality of core layers, each of the plurality of core layers being disposed between selected ones of the metal layers;
a dielectric membrane disposed between other selected ones of the plurality of metal layers;
a port that extends through the metal layers and the core layers but not through the dielectric membrane;
such that the dielectric membrane has a compressed portion and an uncompressed portion, the uncompressed portion extending across the port and the compressed portion being in contact with the other selected ones of the metal layers;
such that the compressed portion of the membrane is effective to operate as a passive electronic component and the uncompressed portion of the membrane is effective to act as a barrier to prevent at least some external debris from traversing through the port;
a transducer disposed over and coupled to the base and communicating with the port, the transducer configured to covert sound energy received from the port into electrical energy.

7. The microphone of claim 6 further comprising a cover attaching to the base, the cover covering the transducer.

8. The microphone of claim 6 further comprising an amplifier coupled to the transducer.

9. The microphone of claim 6 wherein the dielectric constant value of the compressed portion is different than the dielectric constant value of the uncompressed portion.

10. The microphone of claim 6 wherein the membrane comprises an expanded Teflon expanded polytetrafluoroethylene (ePTFE) film.

11. The microphone of claim 6 wherein the electronic component comprises a capacitor.

12. The microphone of claim 6 wherein the port has a diameter greater than approximately 1.0 mm.

* * * * *